United States Patent
Kimura et al.

(10) Patent No.: US 9,048,227 B2
(45) Date of Patent: Jun. 2, 2015

(54) SEMICONDUCTOR DEVICE

(71) Applicant: MITSUBISHI ELECTRIC CORPORATION, Tokyo (JP)

(72) Inventors: Yoshitaka Kimura, Tokyo (JP); Mariko Ono, Fukuoka (JP); Akira Goto, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/099,592

(22) Filed: Dec. 6, 2013

(65) Prior Publication Data

US 2014/0225238 A1   Aug. 14, 2014

(30) Foreign Application Priority Data

Feb. 13, 2013   (JP) ................................. 2013-025670

(51) Int. Cl.
*H01L 23/495*  (2006.01)
*H01L 23/31*  (2006.01)
*H01L 23/049*  (2006.01)
*H01L 23/24*  (2006.01)
*H01L 23/373*  (2006.01)
*H01L 25/065*  (2006.01)
*H01L 23/40*  (2006.01)

(52) U.S. Cl.
CPC .......... *H01L 23/495* (2013.01); *H01L 23/3107* (2013.01); *H01L 2224/48091* (2013.01); *H01L 2224/48137* (2013.01); *H01L 2224/73265* (2013.01); *H01L 23/049* (2013.01); *H01L 23/24* (2013.01); *H01L 23/3735* (2013.01); *H01L 2924/13091* (2013.01); *H01L 23/4006* (2013.01); *H01L 2924/13055* (2013.01); *H01L 25/065* (2013.01)

(58) Field of Classification Search
CPC ........... H01L 2924/01078; H01L 2924/01079; H01L 2924/01029; H01L 23/5226; H01L 23/481
USPC ......... 257/666–668, 796, 787, 788, 706–707, 257/774, 676, 778, 710, 777, 686, 692, 758
See application file for complete search history.

(56) References Cited

U.S. PATENT DOCUMENTS

| | | | |
|---|---|---|---|
| 5,920,119 A | | 7/1999 | Tamba et al. |
| 7,872,337 B2 * | | 1/2011 | Tsunoda .................... 257/678 |

FOREIGN PATENT DOCUMENTS

| | | |
|---|---|---|
| EP | 0962974 A2 | 12/1999 |
| JP | 05-037105 A | 2/1993 |
| JP | 05-067727 A | 3/1993 |
| JP | 09-232512 A | 9/1997 |
| JP | 2000-216332 A | 8/2000 |
| JP | 2001-036004 A | 2/2001 |
| JP | 2002-076197 A | 3/2002 |
| JP | 2007-157863 A | 6/2007 |
| JP | 2007-184315 A | 7/2007 |

* cited by examiner

*Primary Examiner* — Hoa B Trinh
(74) *Attorney, Agent, or Firm* — Studebaker & Brackett PC (57) ABSTRACT

A semiconductor device includes a metal substrate, semiconductor elements, wires, a control terminal, a main electrode terminal, a control substrate, a cover, a sealing resin, a case, and an insulator. The metal substrate includes a metal plate, an insulating layer formed on the top surface of the metal plate, and electrode patterns provided on the insulating layer. The semiconductor elements are secured to different ones of the electrode patterns by solder. The sealing resin seals the components within the case, such as the semiconductor elements. The insulator covers a portion of the surface of the insulating layer and at least a portion of the edge of each electrode pattern.

13 Claims, 9 Drawing Sheets

TOP VIEW IN THE DIRECTION OF ARROW A

B-B' SECTION

SEMICONDUCTOR DEVICE

BACKGROUND OF THE INVENTION

1. Field of the Invention

The present invention relates to a semiconductor device.

2. Background Art

Semiconductor devices in which semiconductor elements are mounted on a metal substrate have been known, as disclosed, e.g., in Japanese Laid-Open Patent Publication No. H05-67727. In the semiconductor device disclosed in this publication, copper circuits are bonded or soldered to the insulating layer formed on the entire surface of a metal substrate. Specifically, in the manufacture of the semiconductor device, solder cream is printed onto portions of a copper circuit laminated to the metal substrate, power semiconductor chips are then mounted on the copper circuit pattern, and these and other components are soldered together in a reflow oven. The circuits on the metal substrate are then interconnected by wire bonding, and the substrate (with the interconnected circuits thereon) is mounted in a case, thereby completing the manufacture of the semiconductor device.

Other prior art includes Japanese Laid-Open Patent Publication No. H5-67727, Japanese Laid-Open Patent Publication No. H5-37105, Japanese Laid-Open Patent Publication No. 2007-184315, Japanese Laid-Open Patent Publication No. H9-232512, Japanese Laid-Open Patent Publication No. 2000-216332, Japanese Laid-Open Patent Publication No. 2002-76197, Japanese Laid-Open Patent Publication No. 2001-36004, and Japanese Laid-Open Patent Publication No. 2007-157863.

Thus, the above prior art semiconductor device includes a metal substrate on which semiconductor elements and other components are mounted. This metal substrate comprises a metal plate of copper, etc. with an insulating layer thereon which is formed, e.g., by bonding an insulating sheet to the surface of the metal plate. A circuit pattern of a conductive material such as copper is formed on the insulating layer. It has been found, however, that the difference in coefficient of liner expansion between the insulating layer and the conductive material circuit pattern thereon may cause cracking in the metal substrate, resulting in delamination of the circuit pattern from the insulating layer.

SUMMARY OF THE INVENTION

The present invention has been made to solve the above problem. It is, therefore, an object of the present invention to provide a semiconductor device of the type described above in which delamination of the conductive material pattern from the insulating layer is minimized.

According to one aspect of the present invention, a semiconductor device includes: a metal substrate, a semiconductor element, a sealing resin, and an insulator. The metal substrate includes a metal plate, an insulating layer formed on a top surface of the metal plate, and a conductive material pattern provided on the insulating layer. The semiconductor element is provided on the conductive material pattern. The sealing resin seals the semiconductor element. The insulator covering a portion of a surface of the insulating layer and at least a portion of an edge of the conductive material pattern.

Other and further objects, features and advantages of the invention will appear more fully from the following description.

DETAILED DESCRIPTION OF THE PREFERRED EMBODIMENTS

First Embodiment

Figure 1:
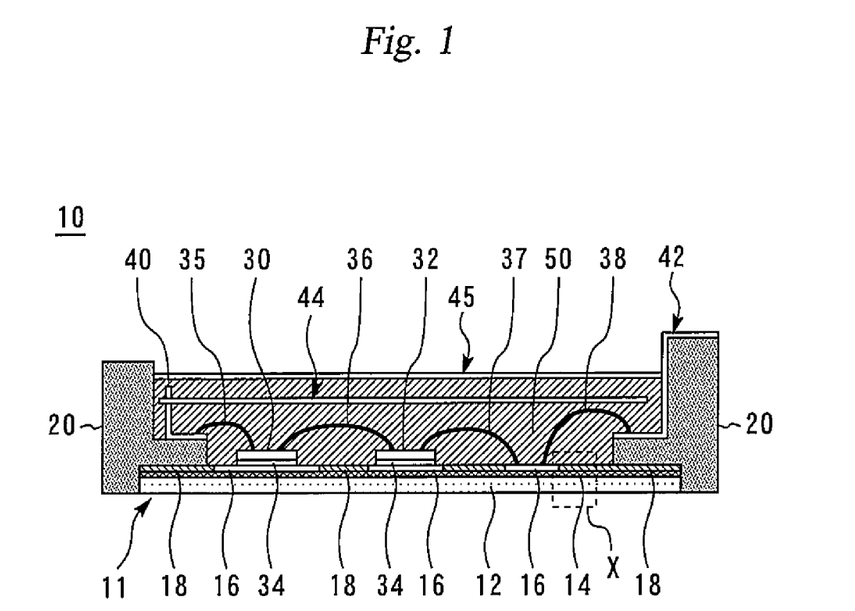
FIG. 1 is a cross-sectional view of a semiconductor device in accordance with a first embodiment of the present invention, showing its internal configuration.

FIG. 1 is a cross-sectional view of a semiconductor device 10 in accordance with a first embodiment of the present invention, showing its internal configuration. The semiconductor device 10 has a metal substrate 11. The metal substrate 11 includes a metal plate 12. An insulating layer 14 is laminated on the top surface 12a of the metal plate 12, and electrode patterns 16 are laminated on the insulating layer 14. The metal plate 12 has a side 12b and a bottom surface 12c in addition to the top surface 12a. The metal plate 12 and the electrode patterns 16 are formed of copper (Cu). The material of the insulating layer 14 is an epoxy-based resin.

A semiconductor element 30 and a semiconductor device 32 are secured onto different ones of the electrode patterns 16 by solder 34. The semiconductor elements 30 and 32 may be one of various types of known power semiconductor elements such as power semiconductor switching elements (IGBTs, MOSFETs, etc.), freewheel diodes, and the like. The details of these semiconductor elements will not be further described.

A wire 35 electrically connects the semiconductor element 30 to a control terminal 40. A wire 36 electrically connects the semiconductor element 30 to the semiconductor element 32. A wire 37 electrically connects the semiconductor element 32 to one of the electrode patterns 16. A wire 38 electrically connects that electrode pattern 16 to a main electrode terminal 42. A control substrate 44 is inserted onto and electrically connected to the control terminal 40.

The space enclosed by the metal substrate 11 and a case 20 (in which the metal substrate 11 is mounted) is filled with a sealing resin 50. The sealing resin 50 is preferably a gel or epoxy resin, since it must have good heat dissipation characteristics. That is, the sealing resin 50 is selected to have sufficient thermal conductivity to dissipate heat generated when the semiconductor elements 30 and 32 are energized. The metal plate 11 and other components mounted in the case 20 are sealed with the sealing resin 50. The semiconductor device 10 further has a cover 45 mounted on the top surface of the sealing resin 50.

As described above, the metal substrate 11 has the electrode patterns 16 on the insulating layer 14. As shown in FIG. 1, the electrode patterns 16 are spaced apart from one another on the top surface of the insulating layer 14. Each electrode pattern 16 has an edge 16b, and an insulator 18 is provided along these edges 16b.

Figure 2:
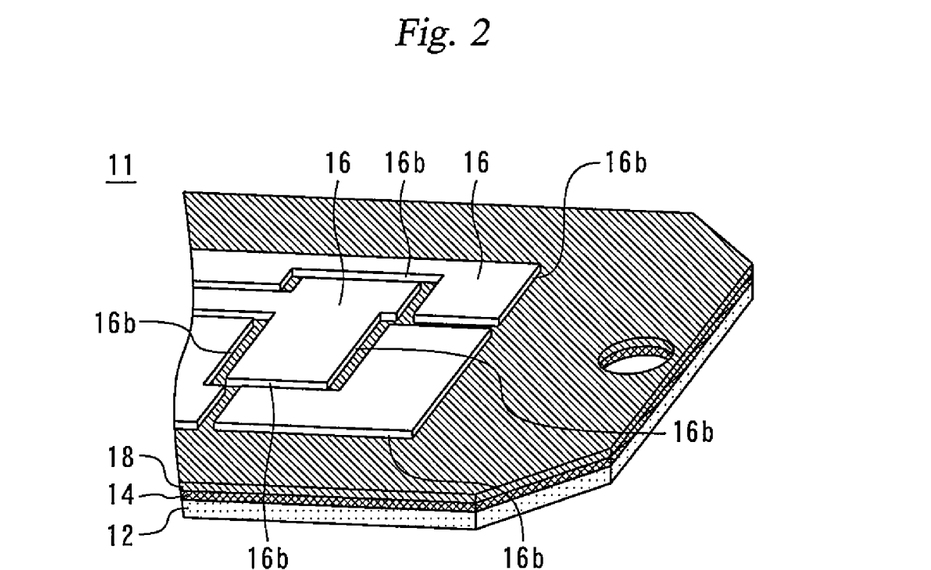
FIG. 2 is a perspective view of a portion of the metal substrate of the semiconductor device of the first embodiment.

FIG. 2 is a perspective view of a portion of the metal substrate 11 of the semiconductor device 10 of the first embodiment. As shown in FIG. 2, each electrode pattern 16 has a top surface 16a and an edge 16b and is a discrete pattern (or island pattern). That is, the edge 16b of each electrode pattern 16 extends around the entire periphery of the electrode pattern 16. This means that the edge 16 of the electrode pattern 16 faces the central portion of the metal substrate 11 as well as the periphery of the metal substrate 11, as shown in FIG. 2.

Figure 3:
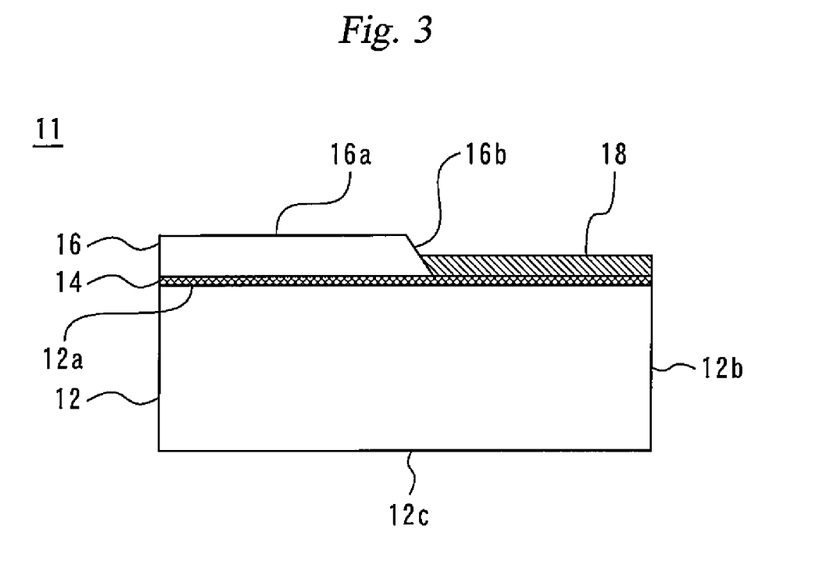
FIG. 3 is an enlarged schematic view of the portion of FIG. 1 enclosed in dashed line X.

FIG. 3 is an enlarged schematic view of the portion of FIG. 1 enclosed in dashed line X. It should be noted that the cross-sectional configuration shown in FIG. 3 extends around the entire periphery of the electrode pattern 16. The insulator 18 extends along the edge 16b of each electrode pattern 16 in the manner shown in FIG. 3. The insulator 18 covers portions of the surface of the insulating layer 14 and a portion of the edge 16b of each electrode pattern 16. In the first embodiment, the insulator 18 has a thickness approximately equal to half the thickness of each electrode pattern 16, as shown in FIG. 1. The insulator 18 serves to prevent delamination of the electrode patterns 16 from the insulating layer 14.

The insulator 18 is an epoxy-based resin. The insulator 18 preferably has a coefficient of linear expansion equal to or substantially equal to that of the insulating layer 14. The coefficients of linear expansion of the insulating layer 14, the insulator 18, and the electrode patterns 16 preferably satisfy the equation:

material of insulating layer 14≤material of insulator 18<electrode patterns 16 (copper)

As shown in FIG. 3, in the first embodiment, the edge 16b of each electrode pattern 16 is tapered in cross-section; specifically, the lower side of the edge 16b of each electrode pattern 16 projects into and is covered by the insulator 18. This increases the surface area of adhesion between the electrode pattern 16 and the insulator 18 and thereby improves the interface adhesion so that the insulator 18 more effectively prevents delamination of the electrode pattern 16. Further, there is reduced stress concentration at the edge 16b.

The semiconductor device of the first embodiment is provided with the case 20, that is, the semiconductor device is of the type mounted in a case. It should be noted, however, that the present invention is not limited to this type of semiconductor device. For example, the metal substrate 11 and the semiconductor elements 30 and 32, etc. may be covered or encapsulated by a molded resin.

It should be further noted that although in the first embodiment the metal plate 12 is formed of copper, in other embodiments it may be formed of aluminum (Al) to reduce its weight.

Second Embodiment

The semiconductor device in accordance with a second embodiment of the present invention is similar in configuration to the semiconductor device 10 of the first embodiment shown in FIG. 1, except that the metal substrate 11 is replaced by a metal substrate 111.

Figure 4:
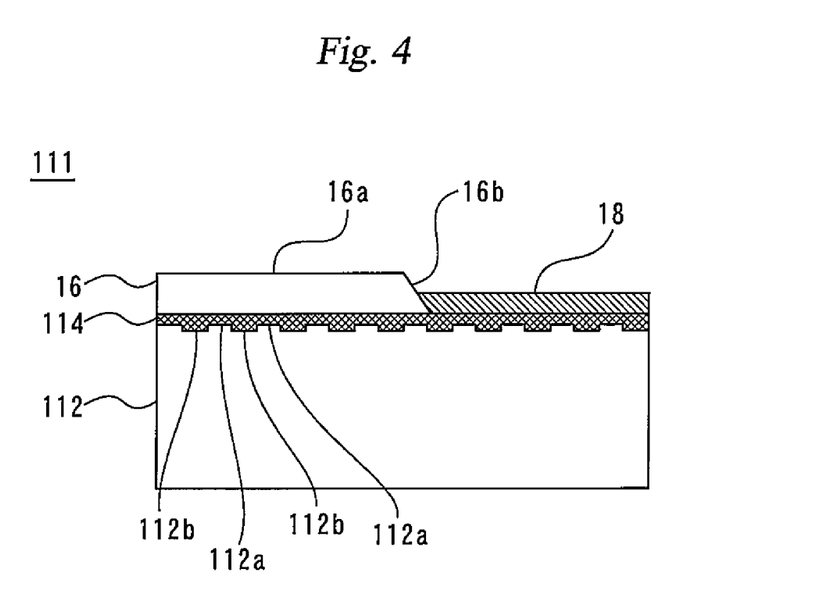
FIG. 4 is an enlarged schematic cross-sectional view of a portion of the metal substrate of the semiconductor device of the second embodiment, wherein this portion corresponds to the portion of FIG. 1 enclosed in dashed line X.

FIG. 4 is an enlarged schematic cross-sectional view of a portion of the metal substrate 111 of the semiconductor device of the second embodiment, wherein this portion corresponds to the portion of FIG. 1 enclosed in dashed line X. The metal substrate 111 includes a metal plate 112 of copper (Cu). The top surface 112a of the metal plate 112 is provided with a plurality of recesses 112b.

The recesses 112b are formed by imparting a satin finish to the top surface 112a of the metal plate 112. The recesses 112b are filled with a portion of an insulating layer 114 formed on the top surface 112a. Like the insulating layer 14 of the first embodiment, the insulating layer 114 is made of epoxy resin. The configuration of the metal plate 112 and the insulating layer 114 described above increases the surface area of adhesion and, hence, the adhesion strength between the metal plate 112 and the insulating layer 114. It should be noted that the above satin finish may be achieved by blasting.

Figure 5:
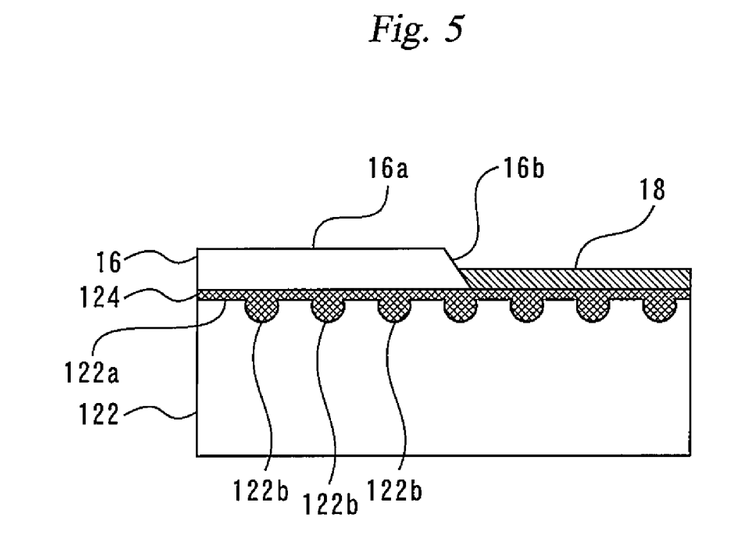
FIG. 5 is a diagram showing a variation of the semiconductor device of the second embodiment.

FIG. 5 is a diagram showing a variation of the semiconductor device of the second embodiment. This semiconductor device includes a metal substrate 121 instead of the metal substrate 111. The metal substrate 121 includes a metal plate 122 of copper (Cu). The top surface 122a of the metal plate 122 is provided with a plurality of recesses 122b. These recesses have a semispherical shape (see the cross-sectional view of FIG. 5). An insulating layer 124 of an epoxy-based resin covers the top surface 122a and fills the recesses 122b. This configuration also increases the surface area of adhesion between the metal plate 122 and the insulating layer 124, resulting in increased adhesion strength between them.

It should be noted that although in the second embodiment the metal plate 112 is formed of copper, in other embodiments it may be formed of aluminum (Al). This facilitates the surface treatment of the metal plate 112, thereby making it easy to form the recesses 112b (or recesses 122b).

Third Embodiment

The semiconductor device in accordance with a third embodiment of the present invention is similar in configuration to the semiconductor device 10 of the first embodiment shown in FIG. 1, except that the metal substrate 11 is replaced by a metal substrate 131.

Figure 6:
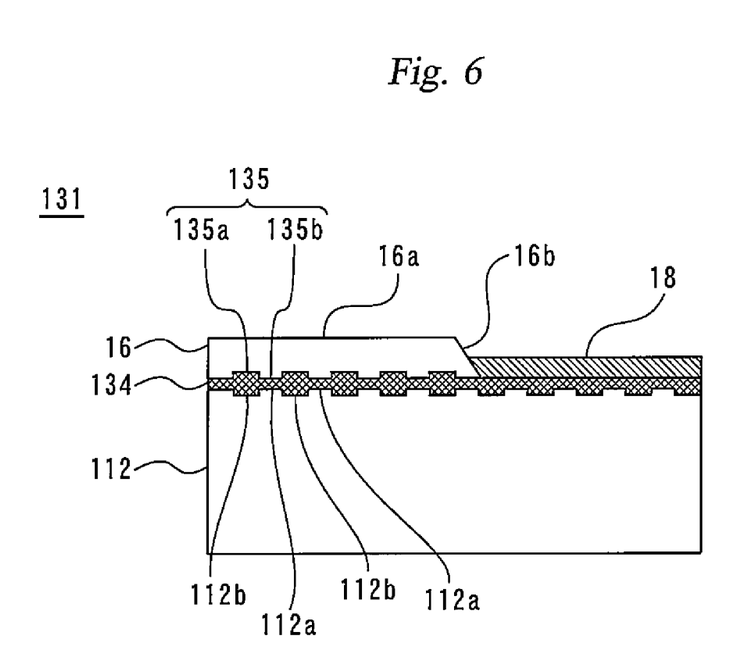
FIG. 6 is an enlarged schematic cross-sectional view of a portion of the metal substrate of the semiconductor device of the third embodiment, wherein this portion corresponds to the portion of FIG. 1 enclosed in dashed line X.

FIG. 6 is an enlarged schematic cross-sectional view of a portion of the metal substrate 131 of the semiconductor device of the third embodiment, wherein this portion corresponds to the portion of FIG. 1 enclosed in dashed line X. Like the metal substrate 111 of the second embodiment, the metal substrate 131 includes the metal plate 112.

An insulating layer 134 of an epoxy-based resin is formed on the metal plate 112, and the portion of the top surface of the insulating layer 134 which is in contact with each electrode pattern 16 is provided with a plurality of alternating projections 135a and recesses 135b. These projections and recesses serve to improve the adhesion between the insulating layer 134 and the electrode patterns 16. The projections 135a and recesses 135b may be formed by satin finishing or blasting of the top surface of the insulating layer 134, as is the case with the top surface 112a of the metal plate 112 of the second embodiment. Alternatively, they may be formed by any other suitable method.

It should be noted that in other embodiments the metal substrate 131 may include the metal plate 12 of the first embodiment, instead of the metal plate 112. In such cases, the insulating layer 134, which has the projections 135a and recesses 135b, is formed on the flat top surface 12a of the metal plate 12. (Unlike the top surface 112a of the metal plate 112 of the second and third embodiments, the top surface 12a of the metal plate 12 is not provided with recesses.) This configuration is still advantageous in that the projections 135a and recesses 135b improve the adhesion between the insulating layer 134 and the electrode patterns 16. Further, the top surface of the insulating layer 134 may be provided with projections 135a and recesses 135b in the entire area in contact with the bottom side of each electrode pattern 16, or alternatively, the top surface may have projections 135a and recesses 135b only in the areas adjacent the edge 16b of each electrode pattern 16 since the edge 16b tends to delaminate from the insulating layer 134.

Fourth Embodiment

The semiconductor device in accordance with a fourth embodiment of the present invention is similar in configuration to the semiconductor device 10 of the first embodiment shown in FIG. 1, except that the metal substrate 11 is replaced by a metal substrate 141.

Figure 7:
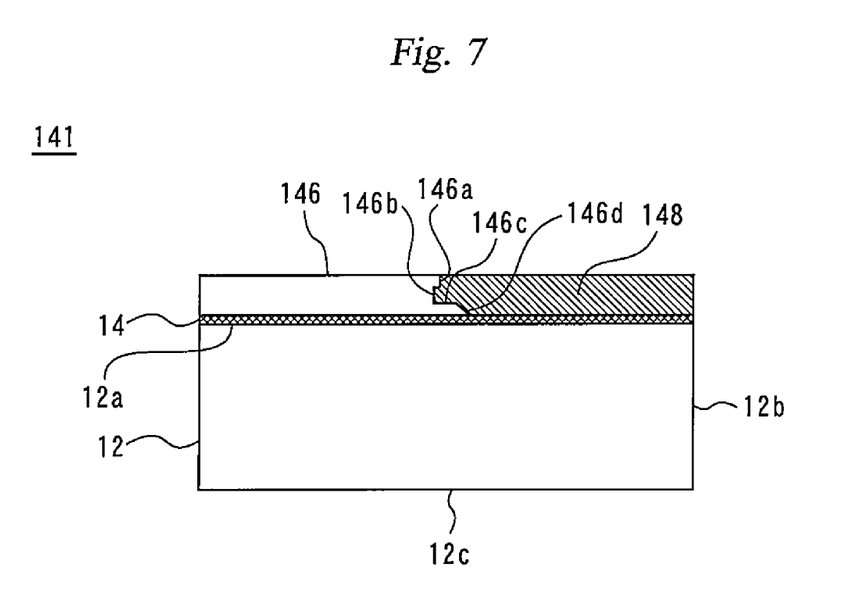
FIG. 7 is an enlarged schematic cross-sectional view of a portion of the metal substrate of the semiconductor device of the fourth embodiment, wherein this portion corresponds to the portion of FIG. 1 enclosed in dashed line X.

FIG. 7 is an enlarged schematic cross-sectional view of a portion of the metal substrate 141 of the semiconductor device of the fourth embodiment, wherein this portion corresponds to the portion of FIG. 1 enclosed in dashed line X. The metal substrate 141 is similar to the metal substrate 11 in that it includes the metal plate 12 and the insulating layer 14, but also differs therefrom in that it includes electrode patterns 146 and an insulator 148 instead of the electrode patterns 16 and the insulator 18. The electrode patterns 146 are made of copper (Cu) and the insulator 148 is made of an epoxy-based resin.

Each electrode pattern 146 has an upper surface, an opposite lower surface, and an edge extending between the upper and lower surfaces. The edge of each electrode pattern 146 has a first projection 146a adjacent the upper surface, a second projection 146c adjacent the lower surface, and a recess 146b formed between the first projection 146a and the second projection 146c by etching. The second projection 146c has a tapered face 146d at its end. The insulator 148 covers the interior surface of the recess 146b.

This configuration increases the surface area of contact and, hence, the adhesion strength between the insulator 148 and the edges of the electrode patterns 146 so that the insulator 148 more effectively prevents delamination of the electrode patterns 146.

It should be noted that in the case of the metal substrate 141 the insulator 148 and the electrode patterns 146 have the same thickness so that the top surface of the insulator 148 is level with the top surfaces of the electrode patterns 146. This ensures that the top surface of the metal substrate 141 is substantially uniform and flat, thereby facilitating operation in the solder printing process and other processes.

It should be further noted that in the metal substrates of the first to third embodiments described above, and in the metal substrates of the fifth and subsequent embodiments described below, the edge of each electrode pattern may be provided with a recess similar to that of the electrode patterns 146 of the fourth embodiment.

Fifth Embodiment

The semiconductor device in accordance with a fifth embodiment of the present invention is similar in configuration to the semiconductor device 10 of the first embodiment shown in FIG. 1, except that the metal substrate 11 is replaced by a metal substrate 151. The metal substrate 151 is similar to the metal substrate 11, except that it includes an insulator 158 instead of the insulator 18.

Figure 8:
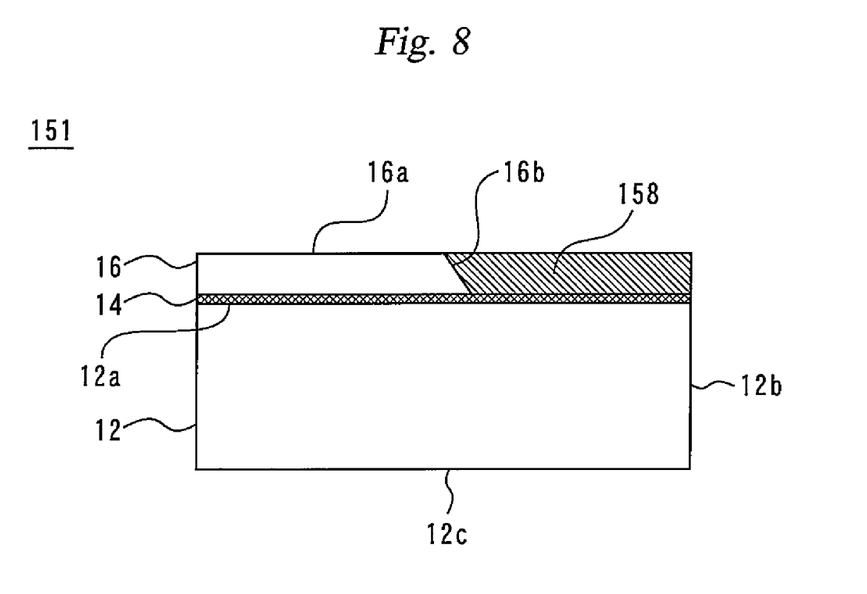
FIG. 8 is an enlarged schematic cross-sectional view of a portion of the metal substrate of the semiconductor device of the fifth embodiment, wherein this portion corresponds to the portion of FIG. 1 enclosed in dashed line X.

FIG. 8 is an enlarged schematic cross-sectional view of a portion of the metal substrate 151 of the semiconductor device of the fifth embodiment, wherein this portion corresponds to the portion of FIG. 1 enclosed in dashed line X. In the metal substrate 11 of the first embodiment, the thickness of the insulator 18 is approximately equal to half the thickness of the electrode patterns 16.

In the metal substrate 151 of the present embodiment, on the other hand, the insulator 158 and the electrode patterns 16 have the same thickness so that the top surface of the insulator 158 is level with the top surfaces of the electrode patterns 16. This ensures that the top surface of the metal substrate 151 is substantially uniform and flat, thereby facilitating operation in the solder printing process and other processes.

It should be noted that in the metal substrates of the first to third embodiments described above, and in the metal substrates of the sixth and tenth embodiments described below, the insulator and the electrode patterns may have the same thickness so that the top surface of the insulator is level with the top surfaces of the electrode patterns, as is the case with the metal substrate 151 of the fifth embodiment.

Sixth Embodiment

The semiconductor device in accordance with a sixth embodiment of the present invention is similar in configuration to the semiconductor device 10 of the first embodiment shown in FIG. 1, except that the metal substrate 11 is replaced by a metal substrate 161.

Figure 9:
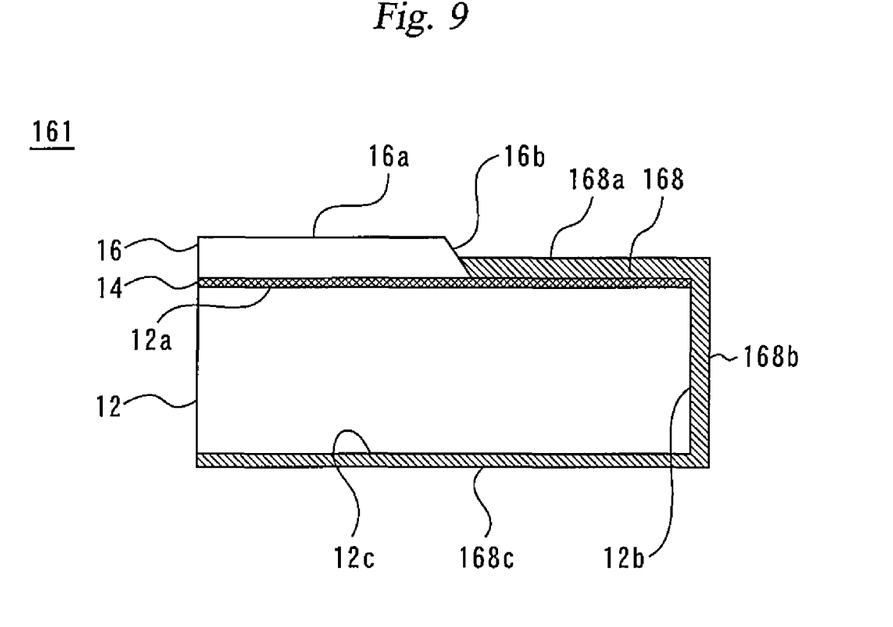
FIG. 9 is an enlarged schematic cross-sectional view of a portion of the metal substrate of the semiconductor device of the sixth embodiment, wherein this portion corresponds to the portion of FIG. 1 enclosed in dashed line X.

FIG. 9 is an enlarged schematic cross-sectional view of a portion of the metal substrate 161 of the semiconductor device of the sixth embodiment, wherein this portion corresponds to the portion of FIG. 1 enclosed in dashed line X. Like the metal substrate 11 of the first embodiment, the metal substrate 161 includes the metal plate 12, the insulating layer 14, and the electrode patterns 16.

However, the metal substrate 161 differs from the metal substrate 11 in that it includes an insulator 168 of an epoxy-based resin which, unlike the insulator 18 of the first embodiment, continuously covers the top surface 12a, the side 12b, and the bottom surface 12c of the metal plate 12. This configuration prevents delamination of the edge of the insulating layer 14 adjacent the side 12b of the metal plate 12 (or adjacent the periphery of the metal substrate 161), as well as preventing delamination of the electrode patterns 16. It should be noted that the insulator 168 may cover only the top surface 12a and the side 12b of the metal plate 12 without covering the bottom surface 12c of the metal plate 12.

It should be further noted that in the metal substrates of the first to fifth embodiments described above, and in the metal substrate of seventh and subsequent embodiments described below, the insulator may cover at least the top surface and a side of the metal plate, as is the case with the metal substrate 161 of the sixth embodiment.

Seventh Embodiment

The semiconductor device in accordance with a seventh embodiment of the present invention is similar in configuration to the semiconductor device 10 of the first embodiment shown in FIG. 1, except that the metal substrate 11 is replaced by a metal substrate 171.

Figure 10:
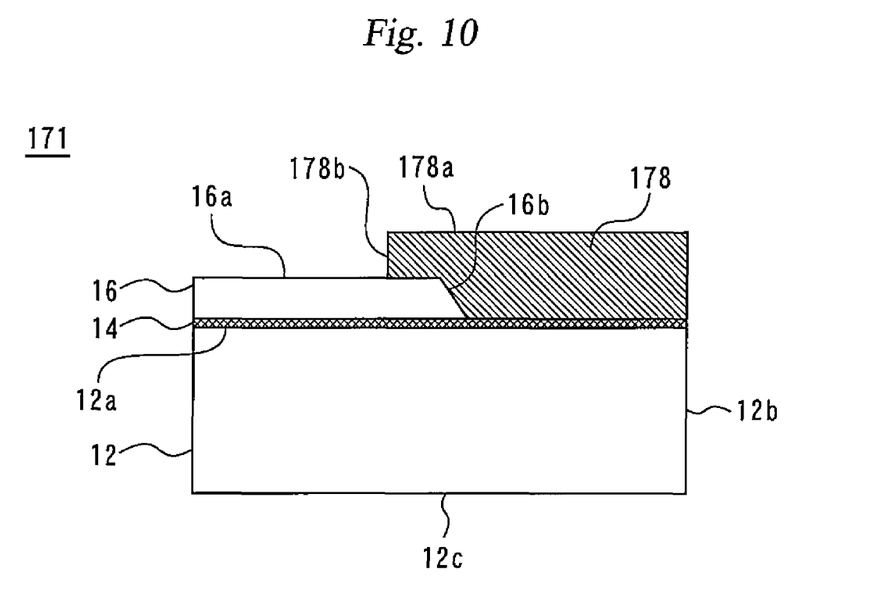
FIG. 10 is an enlarged schematic cross-sectional view of a portion of the metal substrate of the semiconductor device of the seventh embodiment, wherein this portion corresponds to the portion of FIG. 1 enclosed in dashed line X.

FIG. 10 is an enlarged schematic cross-sectional view of a portion of the metal substrate 171 of the semiconductor device of the seventh embodiment, wherein this portion corresponds to the portion of FIG. 1 enclosed in dashed line X. Like the metal substrate 11 of the first embodiment, the metal substrate 171 includes the metal plate 12, the insulating layer 14, and the electrode patterns 16.

However, the metal substrate 171 differs from the metal substrate 11 in that it includes an insulator 178 of an epoxy-based resin which, unlike the insulator 18 of the first embodiment, extends onto the top surface 16a of each electrode pattern 16. That is, the insulator 178 is thicker than each electrode pattern 16 so that the top surface 178a of the insulator 178 is higher than the top surface 16a of the electrode pattern 16. An edge 178b of the insulator 178 is located on the top surface of the electrode pattern 16.

As a result of this configuration, each electrode pattern 16 is vertically secured by the insulator 178, thereby more effectively preventing delamination of the electrode pattern 16.

Eighth Embodiment

The semiconductor device in accordance with an eighth embodiment of the present invention is similar in configuration to the semiconductor device 10 of the first embodiment shown in FIG. 1, except that the metal substrate 11 is replaced by a metal substrate 181.

Figure 11:
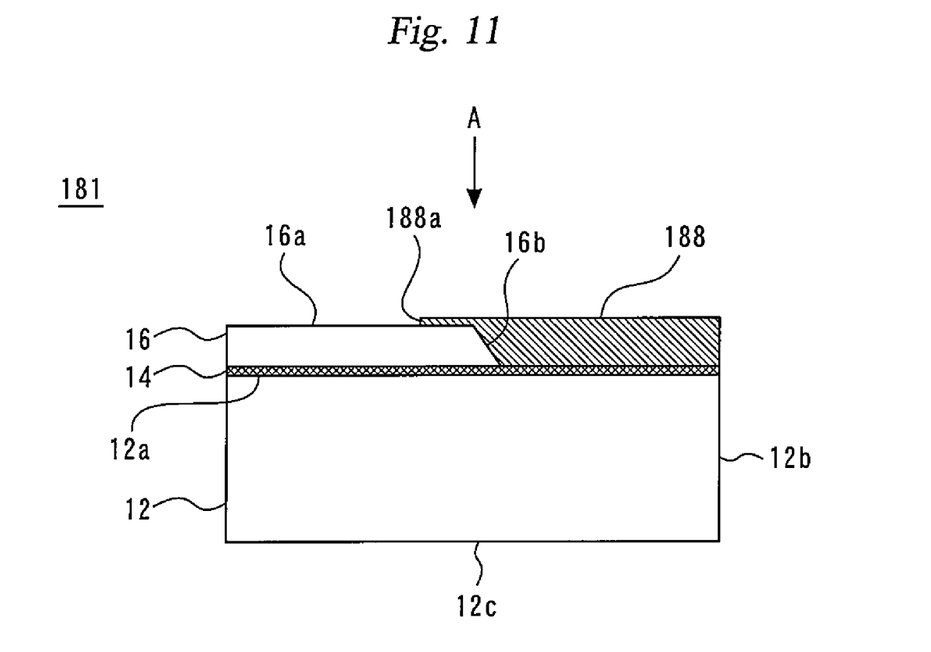
FIG. 11 is an enlarged schematic cross-sectional view of a portion of the metal substrate of the semiconductor device of the eighth embodiment, wherein this portion corresponds to the portion of FIG. 1 enclosed in dashed line X.
Figure 12:
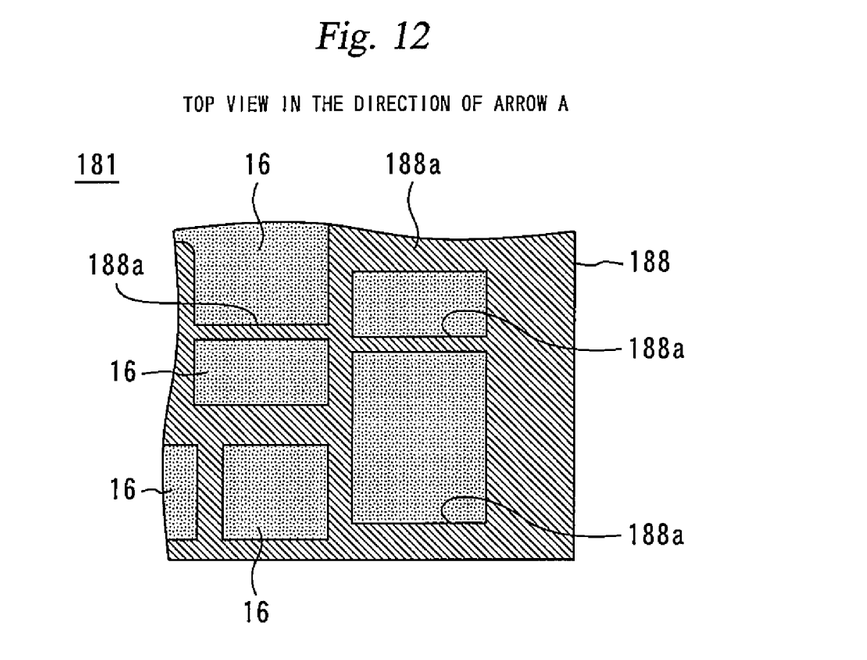
FIG. 12 is a top view of a portion of the metal substrate as viewed in the direction of arrow A in FIG. 11.

FIG. 11 is an enlarged schematic cross-sectional view of a portion of the metal substrate 181 of the semiconductor device of the eighth embodiment, wherein this portion corresponds to the portion of FIG. 1 enclosed in dashed line X. FIG. 12 is a top view of a portion of the metal substrate 181 as viewed in the direction of arrow A in FIG. 11.

Like the metal substrate 11 of the first embodiment, the metal substrate 181 includes the metal plate 12, the insulating layer 14, and the electrode patterns 16. However, the metal substrate 181 differs from the metal substrate 11 in that it includes an insulator 188 of an epoxy-based resin which, unlike the insulator 18 of the first embodiment, extends onto the top surface 16a of each electrode pattern 16.

It should be noted that the metal substrate 181 of the eighth embodiment differs from the metal substrate 171 of the seventh embodiment in that the insulator 188 is thinner than the insulator 178 of the seventh embodiment, thereby facilitating operation in the solder printing process and other processes. Another feature of the metal substrate 181 is that the insulator 188 has a plurality of positioning portions 188a, some of which extend along the edges of electrode patterns 16 and other of which extend across the central portions of the top surfaces 16a of electrode patterns 16, as shown in FIG. 12.

These positioning portions 188a are formed to define the areas where the semiconductor elements 30 and 32 are to be mounted. Thus, the positioning portions 188a shown in FIG. 12 serve to position the semiconductor elements 30 and 32.

It should be noted that one conventional method for positioning a semiconductor element is to form a resist pattern for positioning the semiconductor element. The positioning method of the eighth embodiment described above eliminates the need for such a resist forming process.

Ninth Embodiment

The semiconductor device in accordance with a ninth embodiment of the present invention is similar in configuration to the semiconductor device 10 of the first embodiment shown in FIG. 1, except that the metal substrate 11 is replaced by a metal substrate 191. The metal substrate 191 is similar to the metal substrate 11 in that it includes the metal plate 12 and the insulating layer 14, but also differs therefrom in that the electrode patterns 16 and the insulator 18 are replaced by metal patterns 196 and an insulator 198.

Figure 13:
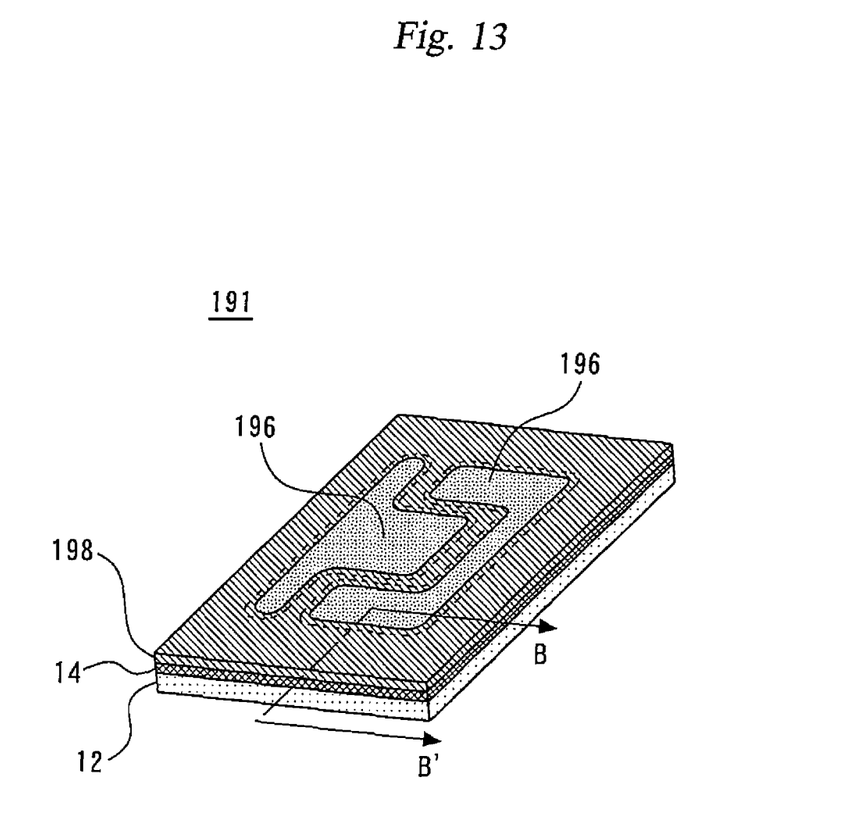
FIGS. 13 to 15 are diagrams illustrating the configuration of the metal substrate of the semiconductor device of the ninth embodiment.
Figure 14:
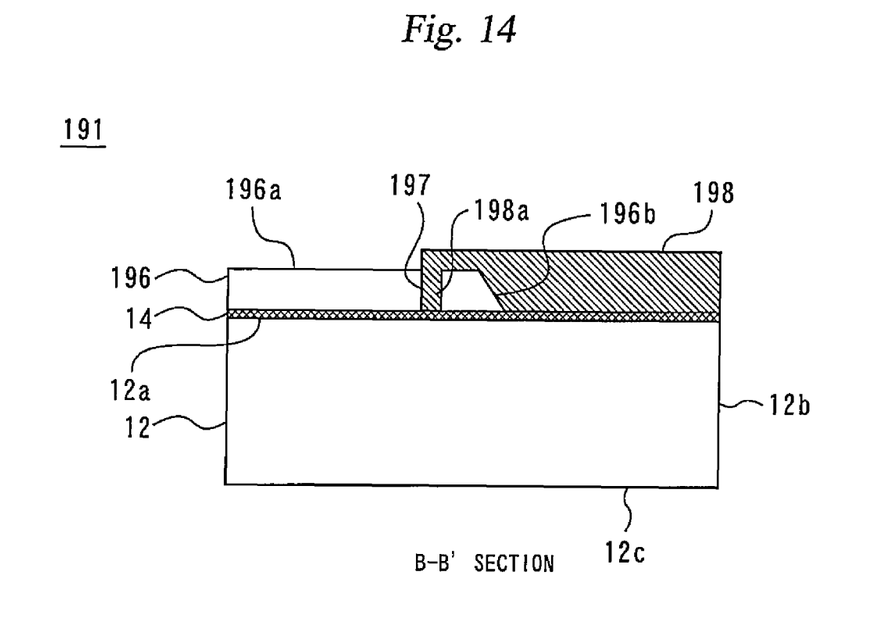
Figure 15:
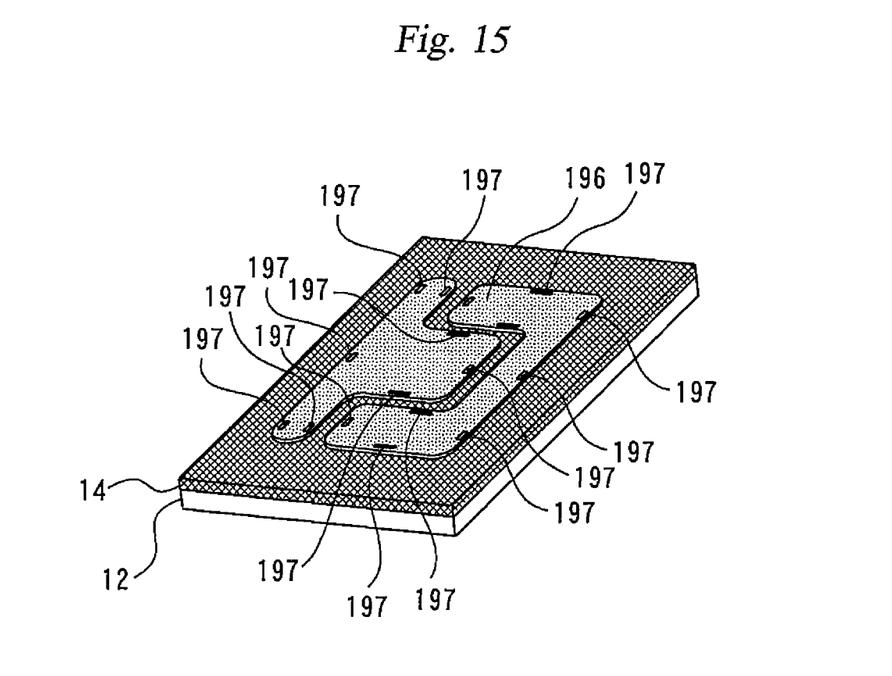

FIGS. 13 to 15 are diagrams illustrating the configuration of the metal substrate 191 of the semiconductor device of the ninth embodiment. Specifically, FIG. 13 is a perspective view of the metal substrate 191. FIG. 14 is an enlarged schematic cross-sectional view of a portion of the metal substrate 191, wherein this portion corresponds to the portion of FIG. 1 enclosed in dashed line X. FIG. 15 is a perspective view of the metal substrate 191, with the insulator 198 removed for convenience of illustration.

The insulator 198 covers the insulating layer 14 and the edge 196b of each metal pattern 196 and extends onto the top surface 196a of the metal pattern 196. Each metal pattern 196 has a plurality of holes 197 below the portion of the insulator 198 which is located on the top surface 196a of the metal pattern 196. As shown in FIG. 15, these holes 197 are disposed at spaced apart locations along the edge of each metal pattern 196. The insulator 198 covers the edge 196b of the metal pattern 196 and extends to fill the holes 197, forming filler portions 198a, each of which is in contact at its tip with the insulating layer 14.

This configuration increases the surface area of contact between the insulating layer 14 and the insulator 198, and furthermore the metal patterns 196 are vertically secured by the insulator 198, thereby improving the adhesion between the metal patterns 196 and the insulating layer 14.

The feature of the eighth embodiment described above may be combined with the ninth embodiment. Specifically, the insulator 198 may have positioning portions similar to the positioning portions 188a of the insulator 188 of the eighth embodiment, and these positioning portions may be used for positioning the semiconductor elements 30 and 32.

Tenth Embodiment

The semiconductor device in accordance with a tenth embodiment of the present invention is similar in configuration to the semiconductor device 10 of the first embodiment shown in FIG. 1, except that the metal substrate 11 is replaced by a metal substrate 211.

Figure 16:
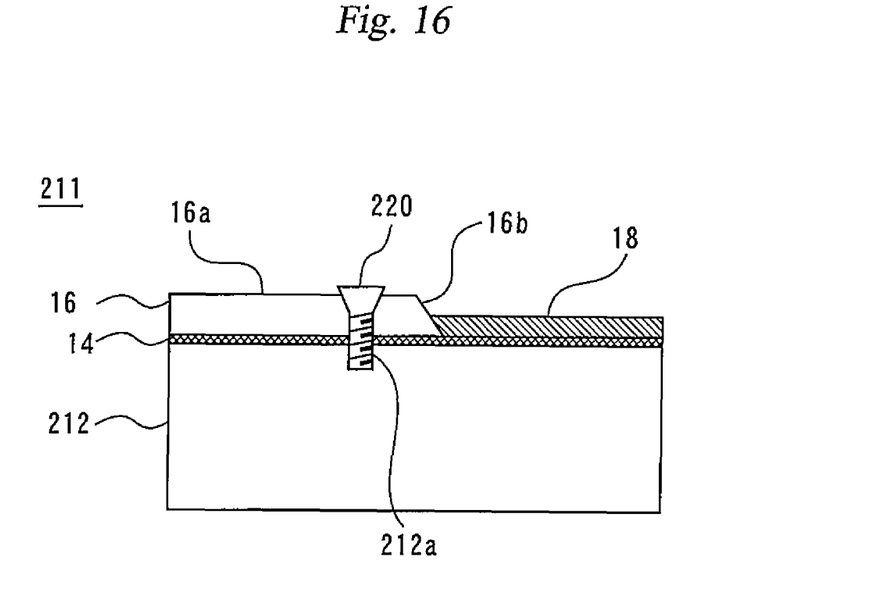
FIG. 16 is an enlarged schematic cross-sectional view of a portion of the metal substrate of the semiconductor device of the tenth embodiment, wherein this portion corresponds to the portion of FIG. 1 enclosed in dashed line X.

FIG. 16 is an enlarged schematic cross-sectional view of a portion of the metal substrate 211 of the semiconductor device of the tenth embodiment, wherein this portion corresponds to the portion of FIG. 1 enclosed in dashed line X. The metal substrate 211 includes the insulating layer 14, the electrode patterns 16, and the insulator 18 described in connection with the metal substrate 11 of the first embodiment and further includes a metal plate 212 and insulating screws 220.

Each insulating screw 220 penetrates through a respective electrode pattern 16 and the insulating layer 14 and is screwed into the metal plate 212. The metal plate 212 has threaded recesses 212a. The insulating screws 220 are preferably ceramic screws having a breakdown voltage of 5.0 kV or more. Specifically, the insulating screws 220 may be made of $Al_2O_3$ or $ZrO_3$. The use of such insulating screws makes it possible to mechanically secure the electrode patterns 16 to the metal plate 212 and thereby more effectively prevent delamination of the electrode patterns 16.

It should be noted that in the metal substrates of the first to ninth embodiments described above, the electrode patterns may be secured to the metal plate by insulating screws, as is the case with the metal substrate 211 of the tenth embodiment.

Eleventh Embodiment

The semiconductor device in accordance with an eleventh embodiment of the present invention is similar in configuration to the semiconductor device 10 of the first embodiment shown in FIG. 1, except that the metal substrate 11 is replaced by a metal substrate 221.

Figure 17:
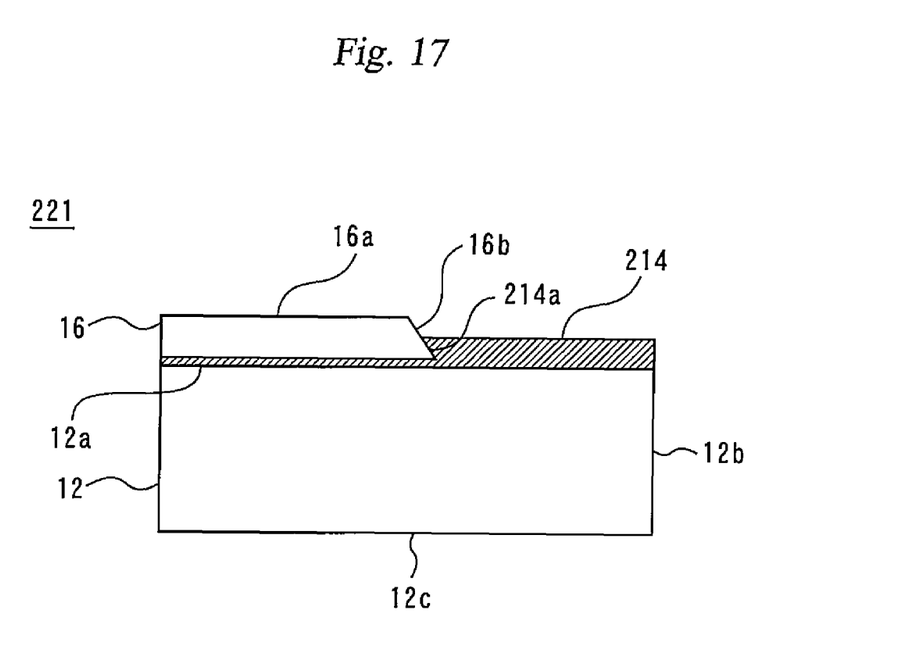
FIG. 17 is an enlarged schematic cross-sectional view of a portion of the metal substrate of the semiconductor device of the eleventh embodiment, wherein this portion corresponds to the portion of FIG. 1 enclosed in dashed line X.

FIG. 17 is an enlarged schematic cross-sectional view of a portion of the metal substrate 221 of the semiconductor device of the eleventh embodiment, wherein this portion corresponds to the portion of FIG. 1 enclosed in dashed line X. The metal substrate 221 is similar in configuration to the metal substrate 11 of the first embodiment, except that the insulator 18 is replaced by an insulator 214. The insulator 214 is formed of the same material as the insulating layer 14. The insulator 214 continuously covers the top surface 12a of the metal plate 12 and the lower portion of the edge 16b of each electrode pattern 16.

The insulating layer 14 and the insulator 214 do not differ in coefficient of linear expansion, since they are made of the same material. In the case of, e.g., the metal substrate 11 of the first embodiment, on the other hand, the insulating layer 14 and the insulator 18 formed on the insulating layer 14 may have different coefficients of linear expansion, since they are formed of different materials. This means that the metal substrate 11 may undergo cracking due to this difference in coefficient of linear expansion, whereas the metal substrate 221 of the eleventh embodiment is immune to such cracking.

It should be noted that in the metal substrates of the first to tenth embodiments described above, the insulating layer and the insulator formed the insulating layer may be made of the same material, as is the case with the metal substrate 221 of the eleventh embodiment.

The features and advantages of the present invention may be summarized as follows. According to one aspect, the present invention provides a semiconductor device having a metal substrate configured to minimize delamination of the conductive material pattern on the insulating layer of the metal substrate.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2013-025670, filed on Feb. 13, 2013 including specification, claims, drawings and summary, on which the Convention priority of the present application is based, are incorporated herein by reference in its entirety.

What is claimed is:

1. A semiconductor device comprising:
    a metal substrate including a metal plate, an insulating layer formed on a top surface of the metal plate, and a conductive material pattern provided on the insulating layer;
    a semiconductor element provided on the conductive material pattern;
    a sealing resin sealing the semiconductor element; and
    an insulator covering a portion of a surface of the insulating layer and at least a portion of an edge of the conductive material pattern.

2. The semiconductor device according to claim 1, wherein:
    a lower side of the edge of the conductive material pattern projects toward the insulator; and
    the insulator covers at least the lower side of the edge of the conductive material pattern.

3. The semiconductor device according to claim 1, wherein the edge of the conductive material pattern has a recess, and the insulator covers an interior surface of the recess.

4. The semiconductor device according to claim 1, wherein the insulator is made of a material having a coefficient of linear expansion equal to that of the insulating layer.

5. The semiconductor device according to claim 1, wherein a top surface of the conductive material pattern is level with a top surface of the insulator.

6. The semiconductor device according to claim 1, wherein the insulator extends onto the conductive material pattern, and a portion of the insulator is located on the conductive material pattern.

7. The semiconductor device according to claim 6, wherein the semiconductor element is positioned by an edge of the portion of the insulator located on the conductive material pattern.

8. The semiconductor device according to claim 6, wherein:
    the conductive material pattern has a hole below the portion of the insulator located on the conductive material pattern; and
    the insulator continuously covers the edge of the conductive material pattern and an interior surface of the hole of the conductive material pattern.

9. The semiconductor device according to claim 1, further comprising projections and recesses formed between the insulating layer and the conductive material pattern.

10. The semiconductor device according to claim 1, wherein the insulator continuously covers at least the top surface and a side of the metal plate.

11. The semiconductor device according to claim 1, wherein the top surface of the metal plate is provided with recesses, and the recesses are filled with a portion of the insulator.

12. The semiconductor device according to claim 11, wherein the recesses are formed by imparting a satin finish to the top surface of the metal plate.

13. The semiconductor device according to claim 1, further comprising an insulating screw which penetrates through the conductive material pattern and the insulating layer and which is screwed into the metal plate.

* * * * *